United States Patent
Nagao et al.

(12)

(10) Patent No.: US 6,177,812 B1
(45) Date of Patent: Jan. 23, 2001

(54) PHASE DETECTOR

(75) Inventors: Fumiaki Nagao, Ibi-gun; Yuji Sakai, Anpachi-gun, both of (JP)

(73) Assignee: Sanyo Electric Co., Ltd., Osaka (JP)

( * ) Notice: Under 35 U.S.C. 154(b), the term of this patent shall be extended for 0 days.

(21) Appl. No.: 09/247,679

(22) Filed: Feb. 9, 1999

(30) Foreign Application Priority Data

Feb. 10, 1998 (JP) .................................................. 10-028713

(51) Int. Cl.[7] .................................................. G01R 25/00
(52) U.S. Cl. .................................. 327/7; 327/7; 327/12; 327/148; 327/150; 327/157; 327/159
(58) Field of Search ................................. 327/7, 12, 148, 327/150, 157, 159

(56) References Cited

U.S. PATENT DOCUMENTS

| | | | |
|---|---|---|---|
| 5,570,053 | * 10/1996 | Takla | 327/292 |
| 5,644,605 | * 7/1997 | Whiteside | 375/375 |
| 5,770,976 | * 6/1998 | Nagaraj | 331/1 A |

\* cited by examiner

*Primary Examiner*—Kenneth B. Wells
*Assistant Examiner*—Cassandra Cox
(74) *Attorney, Agent, or Firm*—Cantor Colburn LLP

(57) ABSTRACT

An output of a flip flop (21) at a first stage is connected to a D-input of a flip flop (22) at a second stage, and an inverted-output of the flip flop (21) is connected to a D-input of a flip flop (23) at a third stage. A reference clock BCK is supplied to the D-input of the flip flop (21), and an oscillation clock OCK is inputted to each T-input of the respective flip flops (21) to (23). An XOR of the reference clock BCK and an output signal Q1 of the flip flop (21), and a logical product of an output signal Q2 of the flip flop (22) and an output signal Q3 of the flip flop (23) are used as a first comparison output PDU and a second comparison output PDD, respectively. With this arrangement, phase comparison can be achieved using a clock of any duty ratio.

3 Claims, 4 Drawing Sheets

PHASE DETECTOR

BACKGROUND OF THE INVENTION

1. Field of the Invention

The present invention relates to a phase detector circuit for used in a phase locked loop (PLL).

2. Description of the Related Art:

FIG. 4 is block diagram showing a structure of a general PLL.

A PLL comprises a phase detector 1, a charge pump 2, a low pass filter 3, a voltage-controlled oscillator 4, and a frequency divider 5. The phase detector 1 compares phases of a reference clock BCK and of a divided clock obtained by dividing an oscillation clock OCK (described later) of the voltage-controlled oscillator 4 to generate outputs PDU, PDD according to the phase difference. The charge pump 2 has a positive constant-current source for supplying a constant current to the output side, and a negative constant-current source for drawing a constant current from the output side, and charges/discharges the low pass filter 3 according to outputs PDU, PDD. The low pass filter 3 removes AC components from the output PD supplied by the charge pump 2, and outputs a voltage Vc which varies according to the output PD. The voltage-controlled oscillator 4 alters an oscillation operation in response to the voltage Vc applied thereinto via the low pass filter 3 to generate an oscillation clock OCK having a frequency according to the voltage Vc. The frequency divider 5 divides an oscillation clock OCK input from the voltage-controlled oscillator 4 at a predetermined ratio to supply a divided clock TCK to the phase detector 1. In the frequency divider 5, an oscillation clock may be divided, for example, into half so that a divided clock TCK with a duty ratio of ½ can be obtained.

With the above PLL, the oscillation frequency of the voltage-controlled oscillator 4 is controlled according to the phase difference between a reference clock BCK and an oscillation clock OCK so that a constant phase difference can be maintained between a reference clock BCK and an oscillation clock OCK.

FIG. 5 is a circuitry diagram showing a structure of a phase detector 1. FIG. 6 is a timing chart explaining the operation of the phase detector 1.

The phase detector 1 includes three flip flops 11, 12, 13 and two XOR (exclusive OR) gates 14, 15. The three flip flops 11, 12, 13, are serially connected, and together constitute a shift register. The flip flop 11 at the first stage receives, via its D-input, a reference clock BCK. The flip flops 11, 12 at the first and second stages, respectively, receive, via each T-input thereof, a divided clock TCK. The flip flop 13 at the third stage receives, via T-input thereof, an inverted clock of a divide clock TCK. With this arrangement, the state of a reference clock BCK is transferred to the flip flops 11, 12 at the first and second stages, respectively, in response to the rise (leading edge) of a divided clock TCK, and further to the flip flop 13 at the third stage in response to the fall (trailing edge) of the divided clock TCK.

The first XOR gate 14 is connected, via two inputs thereof, to the input of a reference clock BCK and to the Q-output of the flip flop 11, respectively, and supplies a logical (exclusive OR) output of the received signals as a comparison output PDU to the charge pump 2. The second XOR gate 15 is connected, via two inputs thereof, to Q-output of the flip flop 12 and Q-output of the flip flop 13, supplies a logical (exclusive OR) output of the received signals as a comparison output PDD to the charge pump 2.

The operation of the above described phase detector 1 will next be described referring to FIG. 6.

A reference clock BCK is taken into the flip flop 11 at the rise of a divided clock TCK. Then, an output Q1 from the flip flop 11 changes following the reference clock BCK, at the rise of the divided clock TCK after the change of the reference clock BCK. Receiving a reference clock BCK and an output Q1, the XOR gate 14 continues sending an output PDU at a low level during a period from the fall of the reference clock BCK to the following rise of the divided clock TCK, and a period from the rise of the reference clock BCK to the following rise of the divided clock TCK, whereby the positive constant-current source of the charge pump 2 is switched on.

An output Q1 from the flip flop 11 is taken into the flip flop 12 at the rise of a divided clock TCK, so that the output Q2 of the flip flop 12 forms a waveform identical to that of the output Q1 delayed by one divided clock TCK cycle. The output Q2 of the flip flop 12 enters the flip flop 13 at the fall of the divided clock TCK, so that the output Q3 from the flip flop 13 forms a waveform identical to that of the output Q2 delayed by ½ cycle of a divided clock TCK. Having received the outputs Q2 and Q3, the XOR gate 15 keeps sending an output PDD at a high level during a period from the rise of the output Q2 to the following rise of the output Q3, and a period from the fall of the output Q2 and the fall of the output Q3, whereby the negative constant-current source of the charge pump 2 is turned on.

Here, the comparison output PDU remains at a low level during a period corresponding to the addition of the difference between when the reference clock BCK changes (a BCK changing point) and when the divided clock TCK falls (a TCK falling point) and a half cycle of the divided clock TCK, or a period corresponding to the subtraction of the former from the latter. That is, in the case where a divided clock TCK lags with respect to a reference clock BCK, the comparison output PDU remains at a low level during a period corresponding to the difference between the BCK changing point and the TCK falling point during a period from the BCK changing point to the TCK falling point and the following half cycle of the divided clock TCK. In the opposite case, i.e., where the divided clock TCK leads, the comparison output PDU remains at a low level during a period shorter than a half cycle of the divided clock TCK by a period corresponding to the difference between the BCK changing point and the TCK falling point.

On the other hand, comparison output PDD becomes a high level at a timing delayed by one divided clock TCK cycle from the rise of the comparison output PDU (a PDU rising point), and thus remains in a half cycle of the divided clock TCK. The comparison output PDD cancels, in the charge pump 2, the "addition" period included in the period with the comparison output PDU at a low level (corresponding to a half cycle of the divided clock TCK), whereby the period with a low-level output PDU is controlled to be shortened depending on the phase difference between the reference clock BCK and the divided clock TCK.

In the above phase detector 1, a period corresponding to a period when the divided clock TCK for operating the flip flops 11–13 remains at a low level is included in the period when the comparison output PDU remains at a low level, and a period with a comparison output PDD at a high level is determined according to the period with the divided clock TCK at a high level. Therefore, the divided clock TCK must be set such that high and low level period become equal. In other words, the duty ratio of a divided clock TCK must be set at ½. In a voltage-controlled oscillator, in which the duty ratio of an oscillation clock is unstable, an oscillation clock is divided to obtain a clock with a ½ duty ratio. This causes a problem such that the oscillation frequency of the voltage-controlled oscillator 4 must be set twice or more as large as the frequency of a divided clock TCK which is used in comparison in the phase detector 1.

SUMMARY OF THE INVENTION

The present invention aims to achieve phase comparison without limiting the duty ratio of the oscillation clock.

In this invention, flip flops constituting a phase detector all operate only at the fall of an oscillation. Therefore, the operation of the circuit remains free from the influence of an oscillation clock with a duty ratio of any value other than ½.

BRIEF DESCRIPTION OF THE DRAWINGS

The above and other objects, features, and advantages of the present invention, will become further apparent from the following description of the preferred embodiments taken in conjunction with the accompanying drawings wherein.

DESCRIPTION OF THE PREFERRED EMBODIMENTS

Figure 1:
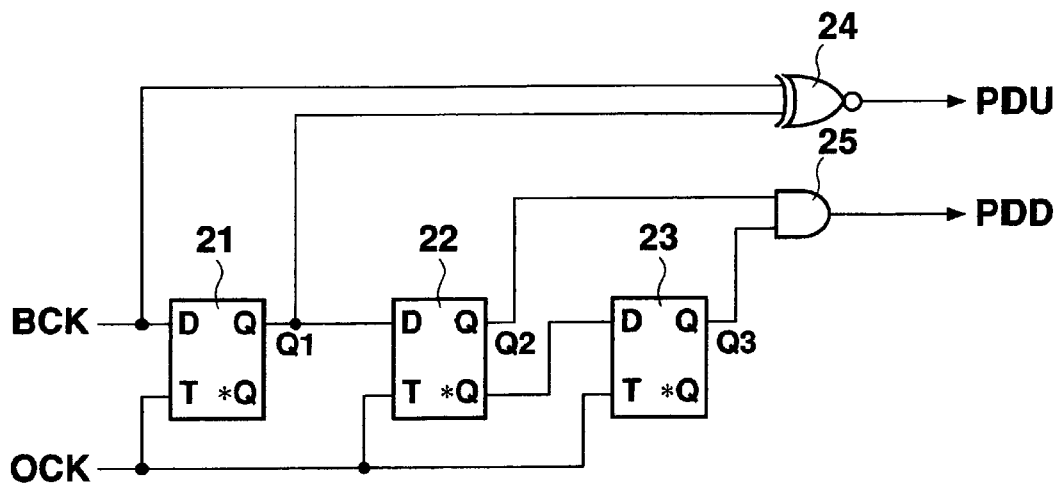
FIG. 1 is a circuitry diagram showing a phase detector according to a first preferred embodiment of the present invention.
Figure 2:
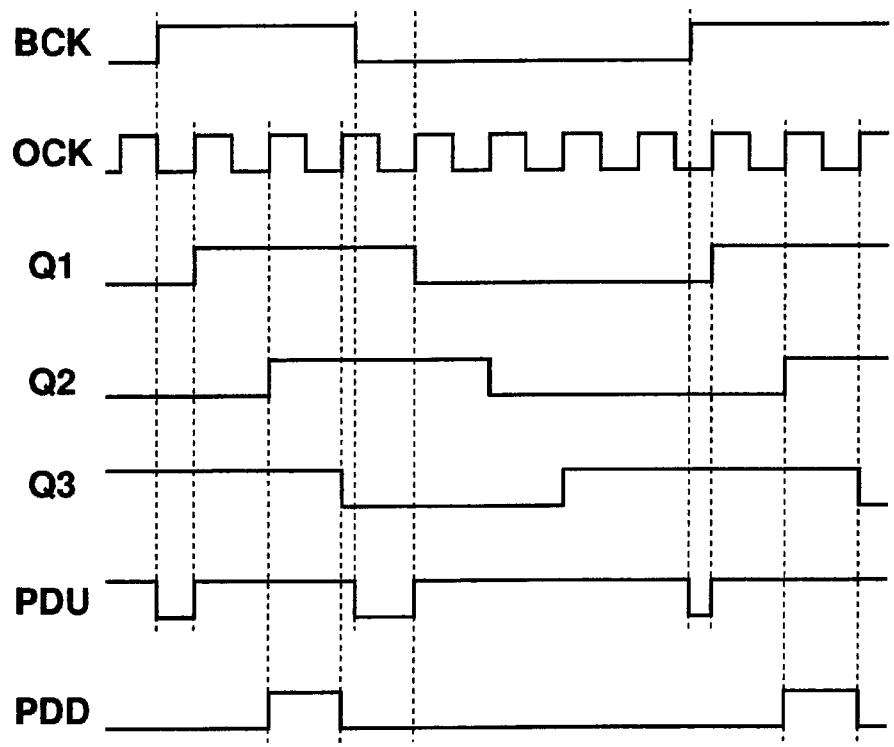
FIG. 2 is a timing chart for explaining an operation of the first preferred embodiment.
Figure 4:
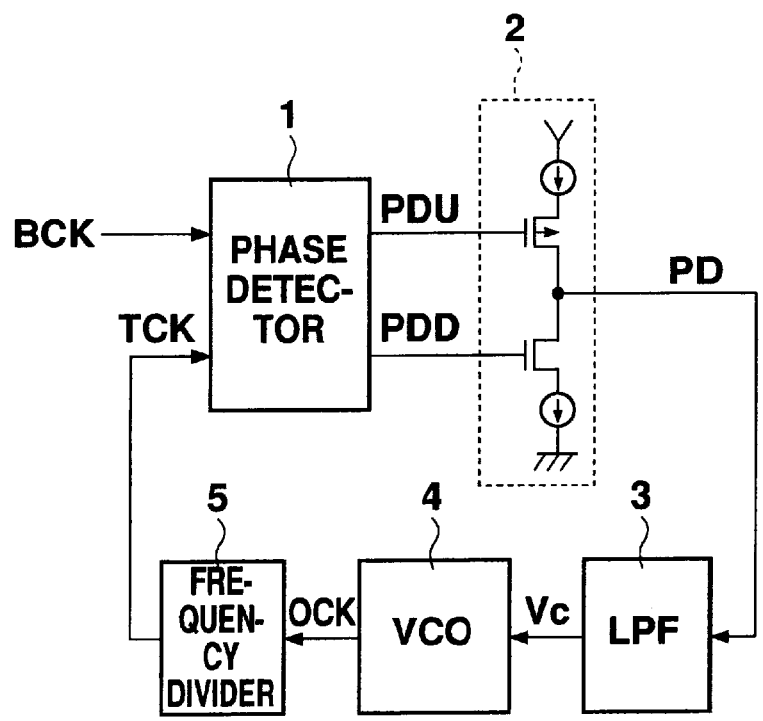
FIG. 4 is a block diagram showing a structure of a general PLL.

FIG. 1 is a circuitry diagram showing a phase detector of a first preferred embodiment of the present invention. FIG. 2 is a timing chart explaining the operation of the phase detector shown in FIG. 1. The phase detector of this invention corresponds to the phase detector 1 shown in FIG. 4, and is constructed to drive a charge pump, using outputs PDU, PDD thereof.

The phase detector of this embodiment comprises three flip flops 21, 22, 23, an XOR (exclusive OR) gate 24, and an AND gate 25. The flip flop 21 at the first stage is connected, via its D-input, to the input of a reference clock BCK. The flip flop 22 at the second stage is connected, via D-input thereof, to Q-output of the flip flop 21 at the first stage. The flip flop 23 at the third stage is connected, via D-input thereof, to *Q-output (inverted-output) of the flip flop 22 at the second stage. The flip flops 21, 22, 23 each are connected, via T input thereof, to an oscillation clock OK. With this arrangement, the state of a reference clock BCK is informed to the flip flops 21, 22 at the first and second stages, respectively, in response to the rise of the oscillation clock OCK, and the inverted value of the state of the reference clock BCK is informed to the flip flop 23 at the third stage.

The XOR gate 24 is connected, via two inputs thereof, to the input of a reference clock BCK and to the Q-output of the flip flop 21, and supplies logical (exclusive OR) output of the received signals as a comparison output PDU to the charge pump. An AND gate 25 is connected, via two inputs thereof, to Q-output of the flip flop 22 and to Q-output of the flip flop 23, and supplies a logical (AND) output of the received signals as a comparison output PDD to the charge pump.

The operation of the above phase shifter will next be described with reference to FIG. 2.

A reference clock BCK is taken into the flip flop 21 at the rise of an oscillation clock OCK. Then, an output Q1 from the flip flop 21 changes following the reference clock BCK, at the rise of the oscillation clock OCK after the change of the reference clock BCK. Receiving a reference clock BCK and an output Q1, the XOR gate 24 keeps sending an output PDU at a low level during a period from the fall of the reference clock BCK to the following rise of the oscillation clock OCK, and a period from the rise of the reference clock BCK to the following rise of the oscillation clock OCK, whereby the positive constant-current source of the charge pump is turned on.

An output Q1 from the flip flop 21 enters the flip flop 22 at the rise of the oscillation clock OCK. Thus, the output Q2 of the flip flop 22 forms a waveform identical to that of the output Q1 delayed by one oscillation clock OCK cycle. An inverted signal of the output Q2 of the flip flop 22 is taken into the flip flop 23 at the rise of the oscillation clock OCK, so that the output Q3 from the flip flop 23 forms a waveform identical to that of the inverted signal of the output Q2 delayed by one oscillation clock OCK cycle. After receiving the outputs Q2 and Q3, the AND gate 25 continues sending an output at a high level during a period from the rise of the output Q2 to the following fall of the output Q3, whereby the negative constant-current source of the charge pump is switched on.

Figure 6:
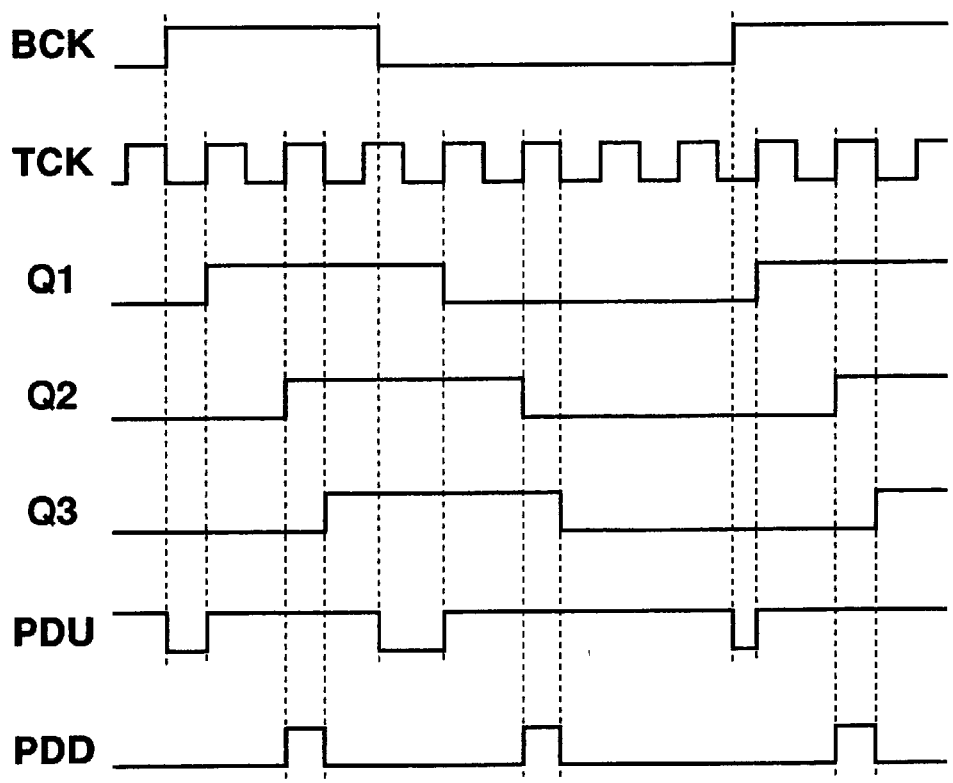
FIG. 6 is a timing chart for explaining an operation of a conventional phase detector.

Here, similar to the case relating to FIG. 6, a comparison output PDU remains at a low level during a period corresponding to an addition or subtraction of the difference between when the reference clock BCK changes (a BCK changing point) and when the oscillation clock OCK falls (an OCK falling point) and or from a half cycle of the oscillation clock OCK. The period with a low-level comparison output PDU appears for every half cycle of a reference clock BCK.

On the other hand, a comparison output PDD becomes a high level at a timing delayed by one oscillation clock OCK cycle from the rise of a comparison output PDU (a PDU rising point), and thus remains in one oscillation clock OCK cycle. The period with a high-level comparison output PDD appears for every reference clock cycle, i.e., for every half cycle in which a comparison output PDU becomes of a low level. Since the period with a high-level comparison output PDD is set twice as long as the period corresponding to the "addition" to the period with a low-level comparison output PDU, the total of the periods with a high-level comparison output PDU coincides with the total of the "additions" of the period with the low-level comparison output PDD. Therefore, the "addition" to the period with a low-level comparison output PDU can be cancelled by the comparison output PDD.

Figure 5:
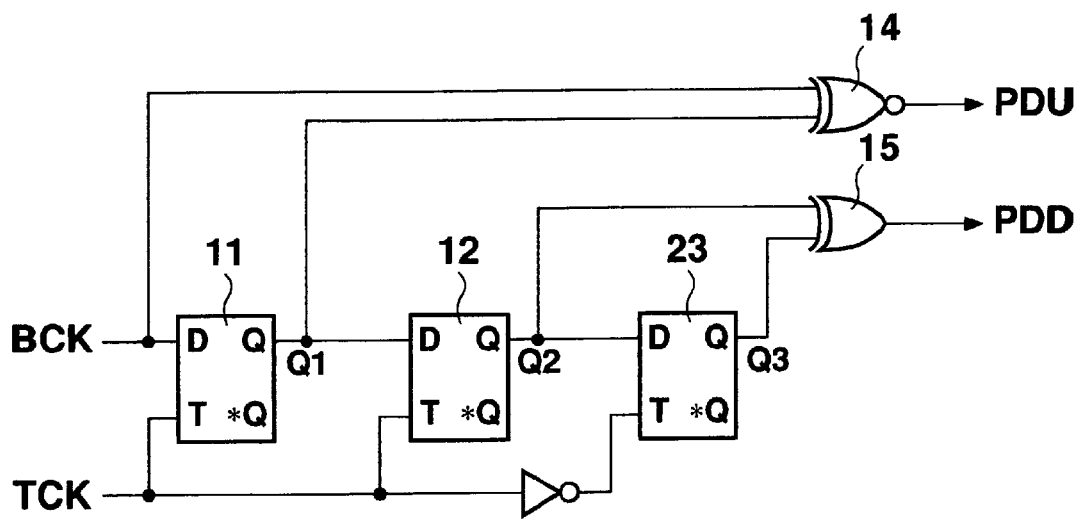
FIG. 5 is a circuitry diagram showing a structure of a conventional phase detector.

Driving a charge pump by using comparison outputs PDU, PDD obtained as above is identical to the process described referring to FIG. 5. In this invention, since an output PDD of the AND gate 25 changes only in response to the rise of an oscillation clock OCK, it is unnecessary to set a ½ duty ratio for an oscillation clock OCK.

Figure 3:
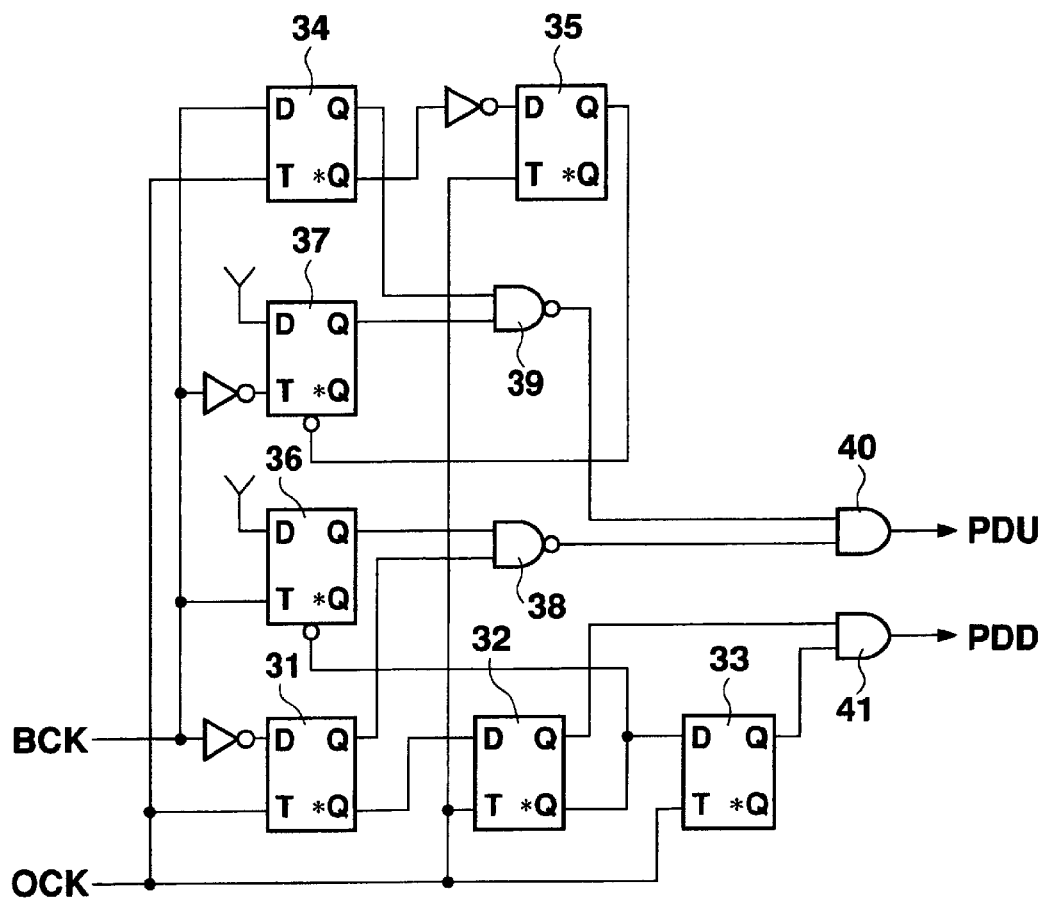
FIG. 3 is a circuitry diagram showing a phase detector according to a second preferred embodiment of the present invention.

FIG. 3 is a circuitry diagram showing a phase detector according to a second preferred embodiment of the present invention.

The phase detector in this embodiment comprises seven flip flops 31-37, two NAND gates 38, 39, and two AND gates 40, 41. The first flip flop 31 is connected, via its D-input, to the input of an inverted signal of a reference clock BCK. The D-input of the second flip flop 32 is connected to a *Q-output (an inverted-output) of the first flip flop 31. The third flip flop 33 is connected, via D-input thereof, to a *Q-output of the second flip flop 32. The D-input of the fourth flip flop 34 is connected to the input of a reference clock BCK. The fifth flip flop 35 is connected, via its D-input, to an inverted signal of the *Q-output of the fourth flip flop 34. These first to fifth flip flops 31–35 each receive, via each T-input, an oscillation clock OCK. With this arrangement, the state of the reference clock BCK is sequentially informed to the respective flip flops 31–35 in response to the rise of an oscillation clock OCK. The sixth flip flop 36 is connected, via its D-input, to a power source potential, and via its T-input, to the input of an inverted signal of a reference clock BCK. The seventh flip flop 37 is connected, similar to the sixth flip flop 36, to a power source potential via its D-input, and to a reference clock BCK via its T-input.

A first NAND gate 38 is respectively connected, via two inputs thereof, to the Q-output of the first flip flop 31 and the Q-output of the sixth flip flop 36. The second NAND gate 39 is connected, via two inputs thereof, to the Q-output of the fourth flip flop 34 and the Q-output of the seventh flip flop 37, respectively. Two inputs of a first XOR gate 40 are connected to respective outputs of the two AND gates 38, 39, to supply a logical (exclusive OR) output of the received signals as a comparison output PDU to the charge pump. A second XOR gate 41 is connected, via its two inputs, to the Q-output of the second flip flop 32 and the Q-output of the third flip flop 33, and supplies a logical (exclusive OR) output of the received signals as a comparison output PDD to a charge pump.

In the above phase shifter, the first to fifth flip flops 31 to 35 all operate at the rise of an oscillation clock so as to obtain outputs PDU, PDD, similar to those shown in FIG. 2.

According to the present invention, it is unnecessary to set a ½ duty ratio for an oscillation clock which is to be used for phase comparison. Therefore, an output of an oscillator, whose duty ratio is unstable, can be taken in intact. This eliminates the need to divide an output clock of a voltage-controlled oscillator, and makes it possible to set a low oscillation frequency.

What is claimed is:

1. A phase detector for detecting a phase difference between a reference clock and an oscillation clock, comprising:

a shift register comprising a plurality off flip flops connected in series, for sequentially shifting a state of the reference clock having been inputted to a flip flop connected at a first stage, at either leading edge or trailing edge of the oscillation clock;

a first logical gate for detecting either one of coincident and not-coincident states between a state of the reference clock and a state of an output signal of the flip flop connected at a first stage of said shift register;

a second logical gate for detecting either a logical product or a logical sum of a state of an output signal of the flip flop connected at a second stage of said shift register and a state of an output signal of the flip flop connected at a third stage of said shift register; and a charge pump driven in response to outputs of said first logical gate and said second logical gate;

wherein the shift register includes flip flops connected at three stages, in which a reference clock is input into a data input terminal of a flip flop at a first stage; a positive output from the flip flop at the first stage is input into a data input terminal of the flip flop at the second stage; a negative output of the flip flop at the second stage is input into a data input terminal of the flip flop at the third stage; and an oscillation clock is input into each of the flip flop clock input terminals.

2. A phase detector according to claim 1, wherein the oscillation clock has a cycle shorter than the reference clock.

3. A phase detector for detecting a phase difference between a reference clock and an oscillation clock having a shorter cycle than the reference clock, comprising:

a first detection circuit for generating a first output having a first polarity during a period determined by adding or subtracting a period corresponding to a difference between either leading edge or trailing edge of the oscillation clock and a leading and trailing edge of the reference clock to or from a half cycle of the oscillation clock; a second detection circuit for generating a second output having a second polarity during one cycle of the oscillation clock which is identical to a cycle of the reference clock; and a charge pump driven in response to the first output and the second output.

* * * * *